United States Patent
Lin et al.

(10) Patent No.: US 10,367,040 B2
(45) Date of Patent: Jul. 30, 2019

(54) DISPLAY PANEL HAVING FORCE SENSING FUNCTION

(71) Applicant: HON HAI PRECISION INDUSTRY CO., LTD., New Taipei (TW)

(72) Inventors: Chang-Ting Lin, New Taipei (TW); Chung-Wen Lai, New Taipei (TW); Kuan-Hsien Jiang, New Taipei (TW); Chang-Chun Wan, New Taipei (TW); Kuo-Sheng Lee, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/437,008

(22) Filed: Feb. 20, 2017

(65) Prior Publication Data
US 2017/0250229 A1    Aug. 31, 2017

Related U.S. Application Data

(60) Provisional application No. 62/300,086, filed on Feb. 26, 2016.

(51) Int. Cl.
| | |
|---|---|
| *H01L 21/00* | (2006.01) |
| *H01L 27/32* | (2006.01) |
| *H01L 51/00* | (2006.01) |
| *G06F 3/041* | (2006.01) |
| *G06F 3/044* | (2006.01) |
| *H01L 27/12* | (2006.01) |
| *H01L 29/423* | (2006.01) |
| *H01L 29/786* | (2006.01) |

(52) U.S. Cl.
CPC ............ *H01L 27/323* (2013.01); *G06F 3/044* (2013.01); *G06F 3/0412* (2013.01); *H01L 27/3225* (2013.01); *H01L 27/3262* (2013.01); *H01L 51/0096* (2013.01); *G06F 2203/04105* (2013.01); *H01L 27/1214* (2013.01); *H01L 29/42384* (2013.01); *H01L 29/78618* (2013.01); *H01L 29/78675* (2013.01); *H01L 51/0097* (2013.01); *Y02E 10/549* (2013.01)

(58) Field of Classification Search
CPC ............... H01L 27/323; H01L 27/3225; H01L 27/3262; H01L 51/0096
See application file for complete search history.

(56) References Cited

U.S. PATENT DOCUMENTS

| | | | |
|---|---|---|---|
| 8,476,706 B1 * | 7/2013 | Chidambarrao | .... H01L 21/8238 257/338 |
| 8,765,510 B2 * | 7/2014 | Lochtefeld | ........ H01L 21/02381 257/101 |
| 9,349,809 B1 * | 5/2016 | Cheng | .................... H01L 29/267 |
| 9,362,355 B1 * | 6/2016 | Cheng | ............... H01L 29/66742 |
| 9,484,347 B1 * | 11/2016 | Cheng | ................. H01L 27/0922 |
| 9,490,335 B1 * | 11/2016 | Doris | .................. H01L 27/0922 |
| 9,569,035 B1 * | 2/2017 | Lee | ........................ G06F 3/0416 |
| 9,620,590 B1 * | 4/2017 | Bergendahl | ......... H01L 29/0673 |

(Continued)

*Primary Examiner* — Laura M Menz
(74) *Attorney, Agent, or Firm* — ScienBiziP, P.C.

(57) ABSTRACT

A display panel, which an also function as a touch input device, includes a substrate and at least one TFT on the substrate. Such a multi-function panel also includes a force sensor sensitive to pressure of touches on the panel. The force sensor includes a first conductive layer and a second conductive layer on the substrate.

16 Claims, 5 Drawing Sheets

(56) References Cited

U.S. PATENT DOCUMENTS

| | | | |
|---|---|---|---|
| 2006/0216897 A1* | 9/2006 | Lee | B82Y 10/00 438/282 |
| 2009/0267917 A1* | 10/2009 | Lee | G02F 1/13338 345/174 |
| 2010/0090967 A1* | 4/2010 | Jang | G06F 3/0412 345/173 |
| 2010/0097345 A1* | 4/2010 | Jang | G06F 3/0412 345/174 |
| 2010/0097355 A1* | 4/2010 | Jang | G06F 3/0412 345/178 |
| 2010/0214236 A1* | 8/2010 | Kim | G06F 3/0412 345/173 |
| 2014/0028616 A1* | 1/2014 | Furutani | G06F 3/044 345/174 |
| 2015/0295084 A1* | 10/2015 | Obradovic | H01L 29/7845 257/347 |
| 2015/0364542 A1* | 12/2015 | Rodder | B82Y 10/00 257/29 |
| 2016/0020305 A1* | 1/2016 | Obradovic | H01L 29/7391 257/39 |
| 2016/0049489 A1* | 2/2016 | Wan | H01L 29/42392 257/347 |
| 2016/0111337 A1* | 4/2016 | Hatcher | H01L 21/823807 438/154 |
| 2016/0126310 A1* | 5/2016 | Rodder | H01L 29/41758 257/9 |
| 2016/0163796 A1* | 6/2016 | Obradovic | B82Y 10/00 257/9 |
| 2017/0323949 A1* | 11/2017 | Loubet | H01L 29/42392 |
| 2017/0344145 A1* | 11/2017 | Lo | G06F 3/044 |

\* cited by examiner

DISPLAY PANEL HAVING FORCE SENSING FUNCTION

CROSS-REFERENCE TO RELATED APPLICATIONS

This application claims priority from U.S. provisional application Ser. No. 62/300,086 filed on Feb. 26, 2016 which is incorporated herein by reference.

FIELD

The subject matter herein generally relates to display technology.

BACKGROUND

An on-cell or in-cell type touch display panel can be formed by integrating a touch panel on a display panel. Such a touch display panel can be used as an output device for displaying images, while being used as an input device for receiving a user's touch on a specific area of a displayed image. However, the touch display panel cannot sense the amount of the touch force applied on the touch display panel. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
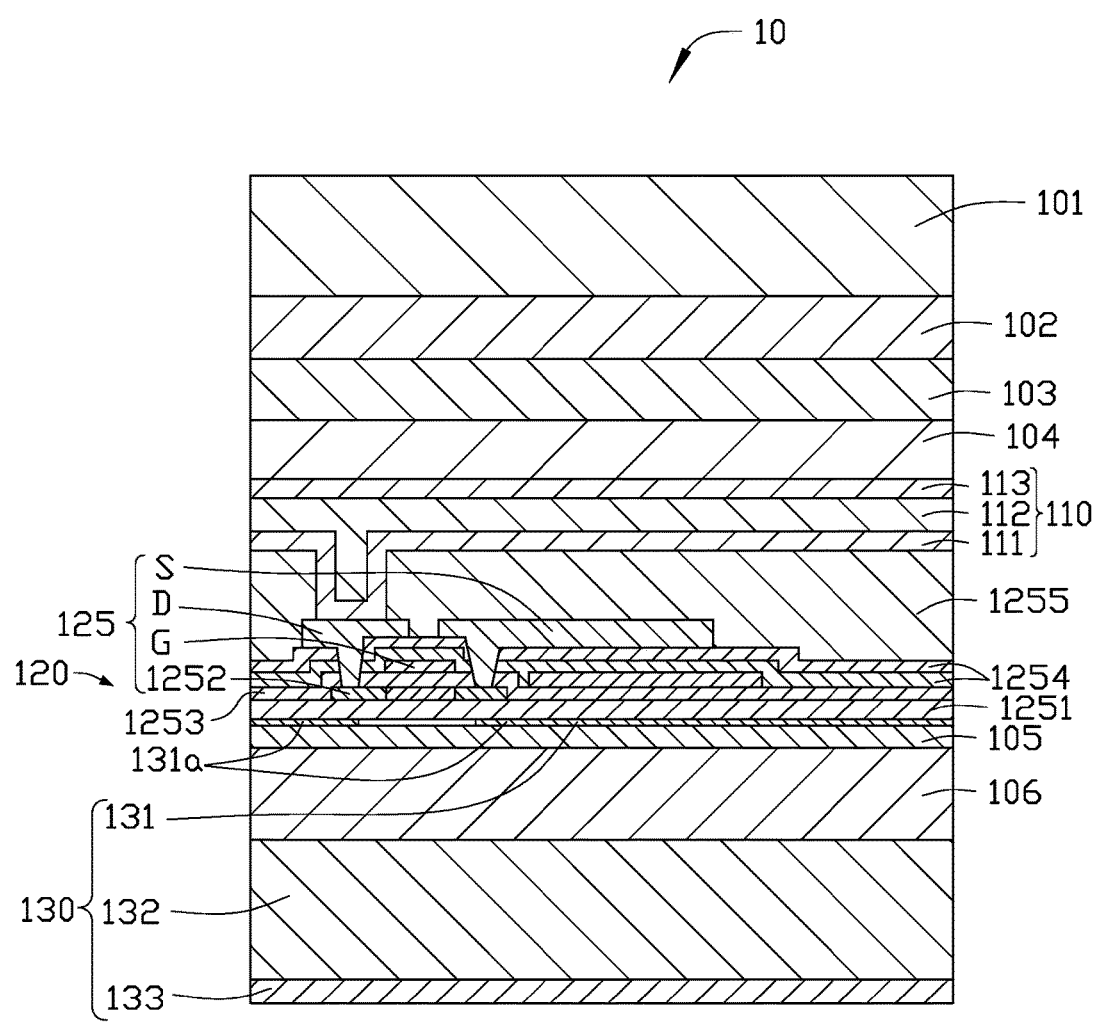
FIG. 1 is a cross-sectional view of a first exemplary embodiment of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

FIG. 1 illustrates a cross-sectional view of a portion of a display panel 10 in accordance with a first exemplary embodiment of the present application. The display panel 10 may be a liquid crystal display panel or an organic light emitting display panel. In this exemplary embodiment, the display panel 10 is an organic light emitting display panel. The display panel 10 has a function of sensing touch force.

The display panel 10 includes a substrate 106, a driving module 120 formed on the substrate 106, and a plurality of light emitting units. 110 formed on a side of the driving module 120 away from the substrate 106. Although FIG. 1 shows only one light emitting unit 110, it should be understood that the display panel 10 may include a plurality of the light emitting units 110.

The substrate 106 is configured to support the light emitting units 110 and the driving module 120. The substrate 106 may be made of a rigid and electrically insulating material, such as glass. In another exemplary embodiment, the display panel 10 may be a flexible display panel, and the substrate 106 may be made of a flexible and electrically insulating material, such as polyimide or polyethylene terephthalate.

The display panel 10 further includes an encapsulation layer 104 formed on a side of the plurality of light emitting units 110 away from the driving module 120, a protecting layer 103 formed above the encapsulation layer 104, a polarizer 102 formed above the protecting layer 103, and a cover 101 formed above the polarizer 102.

The display panel 10 further includes a first conductive layer 131 between the driving module 120 and the substrate 106, an elastic layer 132 formed on a side of the substrate 106 away from the first conductive layer 131, and a second conductive layer 133 formed at a side of the elastic layer 132 away from the first conductive layer 131. The first conductive layer 131, the elastic layer 132, and the second conductive layer 133 cooperatively form a force sensor 130.

The display panel 10 further includes a barrier layer 105 between the first conductive layer 131 and the substrate 106. In other embodiments, the barrier layer 105 can be omitted.

The encapsulation layer 104 and the barrier layer 105 cooperatively encapsulate the light emitting unit 110, to prevent the ingress of water and atmospheric gases from entering into the light emitting unit 110. The protecting layer 103 is located above the encapsulation layer 104, and configured to protect the encapsulation layer 104 and the light emitting unit layer 110.

The cover 101 is made of a transparent material, such as glass or plastic. The cover 101 covers the polarizer 102, and includes a surface facing away from the polarizer 102 that functions as a touch surface.

The light emitting unit 110 is a common light emitting unit used in organic light emitting display panels. The light emitting unit 110 has an anode layer 111, a cathode layer 113, and a light-emitting layer 112 between the anode layer 111 and the cathode layer 113. The light-emitting layer 112 includes an electron transporting layer (ETL, not shown), an organic light-emitting layer (OLEL, not shown), a hole transporting layer (HTL, not shown), and a hole injection layer (HIL, not shown), stacked in that order.

The driving module 120 includes a plurality of thin film transistors (TFTs) 125 formed on the substrate 106, although FIG. 1 shows only one TFT 125, The TFT 125 comprises a channel layer 1252, a gate electrode G, a source electrode S, and a drain electrode D. The driving module 120 further includes a buffer layer 1251, a first insulative layer 1253, a second insulative layer 1254, and a planar layer 1255. The buffer layer 1251 is formed on the substrate 106, and the channel layer 1252 is formed on the buffer layer 1251. The first insulative layer 1253 is formed on the buffer layer 1251 and covers the channel layer 1252, The gate electrode G is formed on the insulative layer 1253. The second insulative layer 1254 is formed on the first insulative layer 1253 and covers the gate electrode G. Both the source electrode S and the drain electrode D are formed on the second insulative layer 1254, and extend through the second insulative layer 1254 and the first insulative layer 1253 to electrically couple to the channel layer 1252. The planar layer 1255 is formed on the second insulative layer 1254 and covers the source electrode S and the drain electrode D. In this exemplary embodiment, the second insulative layer 1254 is a double-layered laminate. The anode layer 111 is formed on the planar layer 1255 and extends through the planar layer 1255 to electrically couple to the drain electrode D. In this exemplary embodiment, the second insulative layer 1254 is a double-layer laminate.

The TFTs 125 comprise a plurality of TFTs 125a and a plurality of TFTs 125b. The TFTs 125a function as switching TFTs, and the TFTs 123b function as driving TFTs. For example, the TFT 125 shown in FIG. 1 is a TFT 12511 The structure of TFT 125a is same as that the structure of the TFT 125b, except that a drain electrode of the TFT 125a is not electrically coupled to the anode layer 111.

Figure 2:
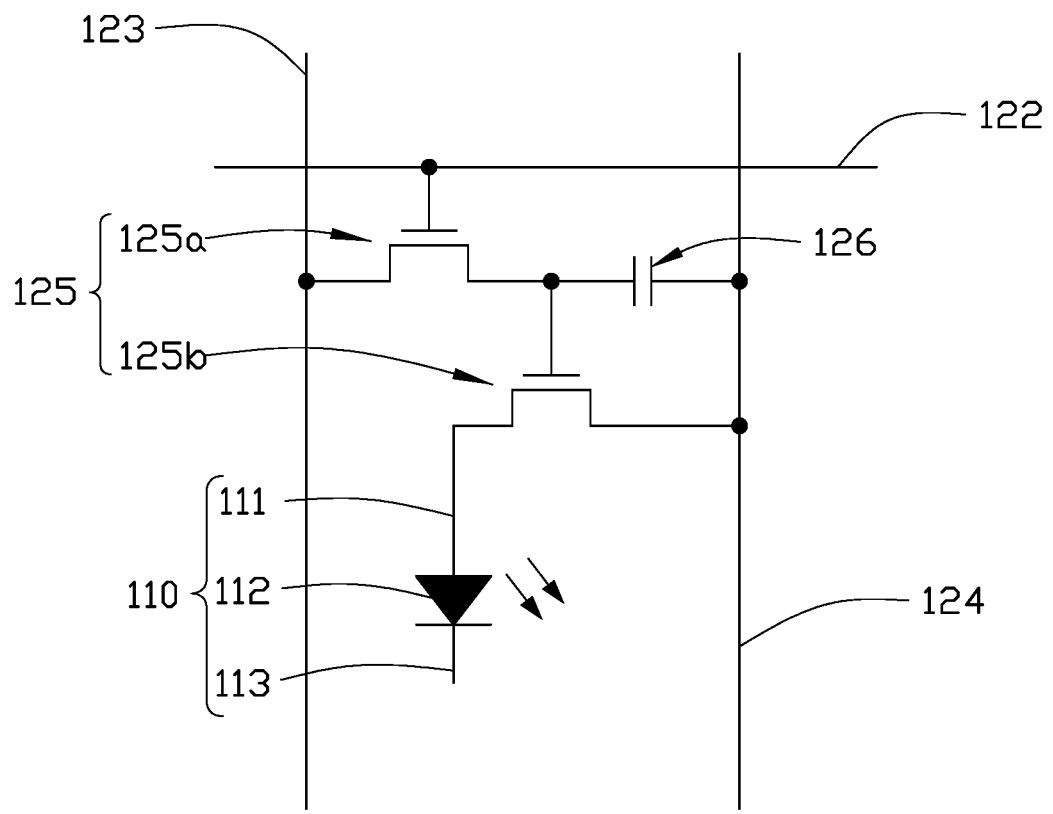
FIG. 2 is a circuit diagram of a pixel of the display panel of FIG. 1.

The driving module 120 further includes a plurality of storage capacitors 126, a plurality of gate lines 122, a plurality of data lines 123, and a power line 124, although FIG. 2 shows only one storage capacitor 126, only one gate line 122, only one data lines 123, only one TFT 125a, only one TFT 125b, and only one light emitting unit 100. The data lines 123 and the gate lines 122 perpendicularly intersect with each other, and are insulated from each other. The display panel 10 includes a plurality of pixel units (not shown). Each pixel unit (not shown) is defined in intersection area defined by two adjacent data lines 23 and two adjacent gate lines 122.

As shown in FIG. 2, one TFT 125a, one TFT 125b, one storage capacitor 126, and one light emitting unit 110 correspond to one pixel unit. A gate electrode (not shown) of the TFT 125a is electrically coupled to the gate line 122, a source electrode (not shown) of the TFT 125a is electrically coupled to the data line 123, and a drain electrode (not shown) of the TFT 125a is electrically coupled to the power line 124 through the storage capacitor 126. A gate electrode G of the TFT 125b is electrically coupled to the drain electrode of TFT 125a, a drain electrode D of the TFT 125b is electrically coupled to the anode layer 111 of the light emitting unit 110, and a source electrode S of the TFT 125b is electrically coupled to the power line 124.

When a scanning signal is applied to the gate line 122, the TFT 125a is powered on, and the data line 123 transmits a signal to the gate electrode of the TFT 125b. When the TFT 125a is powered off, a voltage applied to the gate electrode of the TFT 125b is maintained by the storage capacitor 126, and the TFT 125b outputs a constant current to the light emitting unit 110. The power line 124 can supply a bias voltage to control light intensity of the light emitting unit 110.

The force sensor 130 is configured to sense the amount of touch forces applied on the display panel 10. The force sensor 130 is a capacitive force sensor. The elastic layer 132 is made of a common elastic material. For example, the elastic material may be selected from at least one group consisting of sponge, foam tape, rubber, and spring. The elastic layer 132 is deformable. A distance between the first conductive layer 131 and the second conductive layer 133 can vary according to the pressure applied, which causes a capacitance of a capacitor defined by the first conductive layer 131 and the second conductive layer 133 to change, thus an intensity or amount of the touch force can be calculated according to variation of the capacitance of the capacitor.

Figure 3:
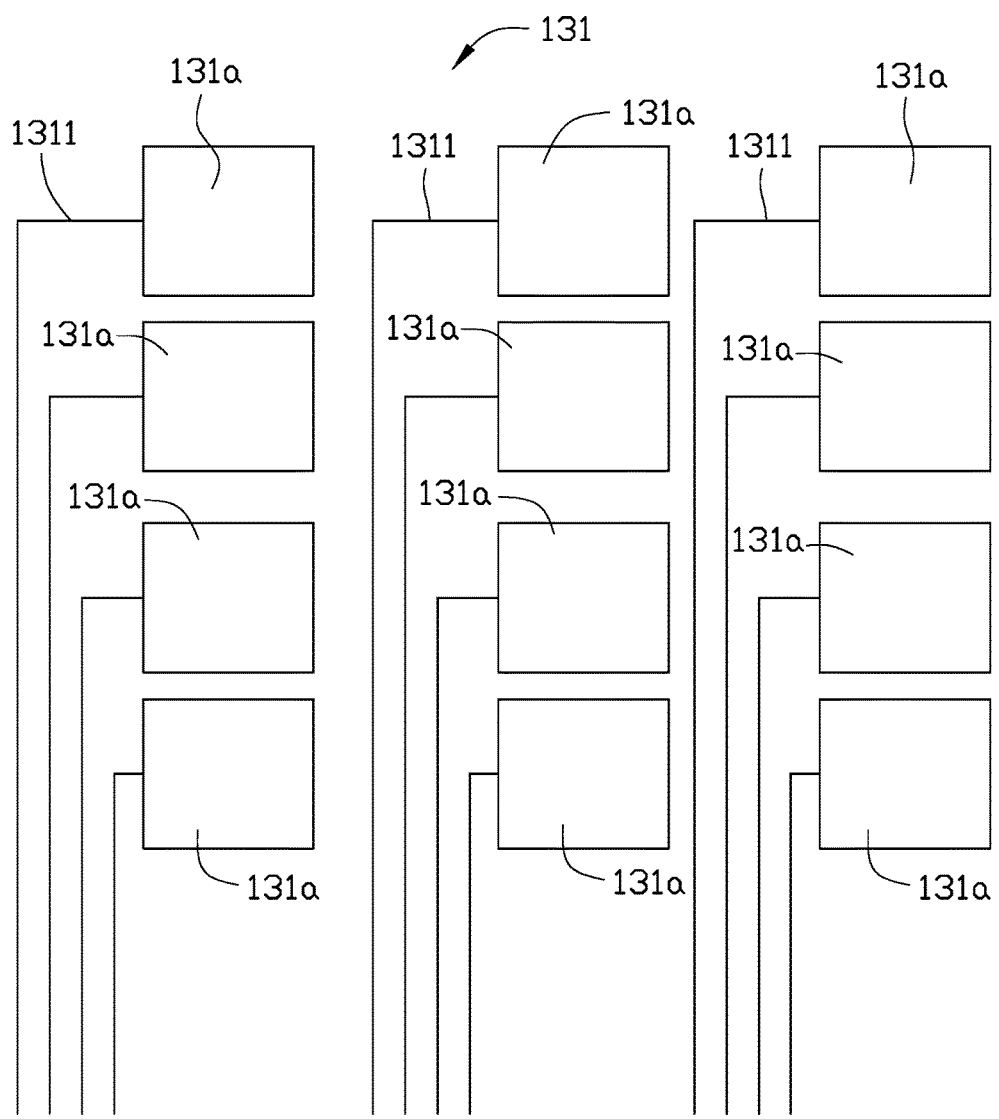
FIG. 3 is a planar view of a first electrode layer of the display panel of FIG. 1.

As shown in FIG. 3, the first conductive layer 131 comprises a plurality of electrode units 131a spaced apart from each other. The plurality of electrode units 131a is arranged in an array. Each electrode unit 131a is electrically coupled an external circuit (not shown) by a conductive line 1311. Thus, signals pertaining to the touch, forces can be transmitted from the electrode units 131a to the external circuit by the conductive lines 1311.

In this exemplary embodiment, the electrode units 131a not only function as electrodes for sensing touch position, but, also function as electrodes for sensing touch force. The electrode units 131a are shared with the touch sensor of the display panel 10. The driving for touch sensing and the driving for force sensing are carried out in a time division method. The external circuit (not shown) of the display panel 10 alternately drives the electrode units 131a to detect touch operation and to detect touch force in a single frame time.

The channel layer 1252 defines a source region directly coupling to the source electrode S, a drain region coupling to the drain electrode D, and an active region between the source region and the drain region. Charge carriers may move through in the active region. As shown in FIG. 1, the active region of the channel layer 1252 faces a gap between two adjacent electrode units 131a. In this exemplary embodiment, the TFT 125 is a top-gate TFT, and a projection of the active region of the channel layer 1252 on the substrate 106 does not overlap any projections of the electrode units 131a on the substrate 106. Thus, the electrode units 131a cannot affect a current passing through the TFT 125 during a force sensing time, and the light intensity of the light emitting unit 110 cannot be interfered with by the electrode units 131a.

In another exemplary embodiment, when the TFT 125 is a bottom-gate TFT, a projection of the gate electrode G on the substrate 106 does not overlaps any projections of the electrode units 131a on the substrate 106. Thus, the electrode units 131a does not interfere with the gate electrode G.

The channel layer 1252 of the TFT 125 may be made of a semiconducting material containing polycrystalline silicon. The channel layer 1252 may be doped with P-type dopants or N-type dopants. The P-type dopant is an ion having a valence charge of plus three, such as boron ion; and the N-type dopant is an ion having a valence charge of plus five, such as phosphate ion. When the channel layer 1252 of the TFT 125a is doped with P-type dopants and positive voltages are applied to the electrode units 131a during the force sensing time, a projection of the active region in the TFT 125a on the substrate 106 may overlap a projection of one of the electrode units 131a on the substrate 106 or a projection of the active region in the TFT 125a on the substrate 106 may not overlap a projection of one of the electrode units 131a on the substrate 106. However, a projection of the active region of the TFT 125b on the substrate 106 must always not overlap any projections of the electrode units 131a on the substrate 106.

The plurality of electrode units 131a can be defined by a single conductive layer and formed in a single patterning process. The first conductive layer 131 and the second conductive layer 133 may be made of aluminum (Al), silver (Ag), gold (Au), cobalt (Co), chromium (Cr), copper (Cu), indium (In), manganese (Mn), molybdenum (Mo), nickel (Ni), neodymium (Nd), palladium (Pd), platinum (Pt), titanium (Ti), tungsten (W), zinc (Zn), or other suitable conductive materials or mixture/alloys thereof. The first conductive layer 131 and the second conductive layer 133 may be made of a transparent conductive material, such as indium tin oxide (ITO), indium zinc oxide (IZO), aluminum doped zinc oxide (AZO), or a suitable combination thereof.

In other exemplary embodiments, the first conductive layer 131 may be a continuous layer. In that case, the first conductive layer 131 do not function as electrodes for sensing touch position.

In this exemplary embodiment, the second conductive layer 133 is a continuous layer. In other embodiments, the second conductive layer 133 may include a plurality of second electrodes (not shown) spaced apart from each second electrode corresponds to one of the electrode units 131a.

Figure 4:
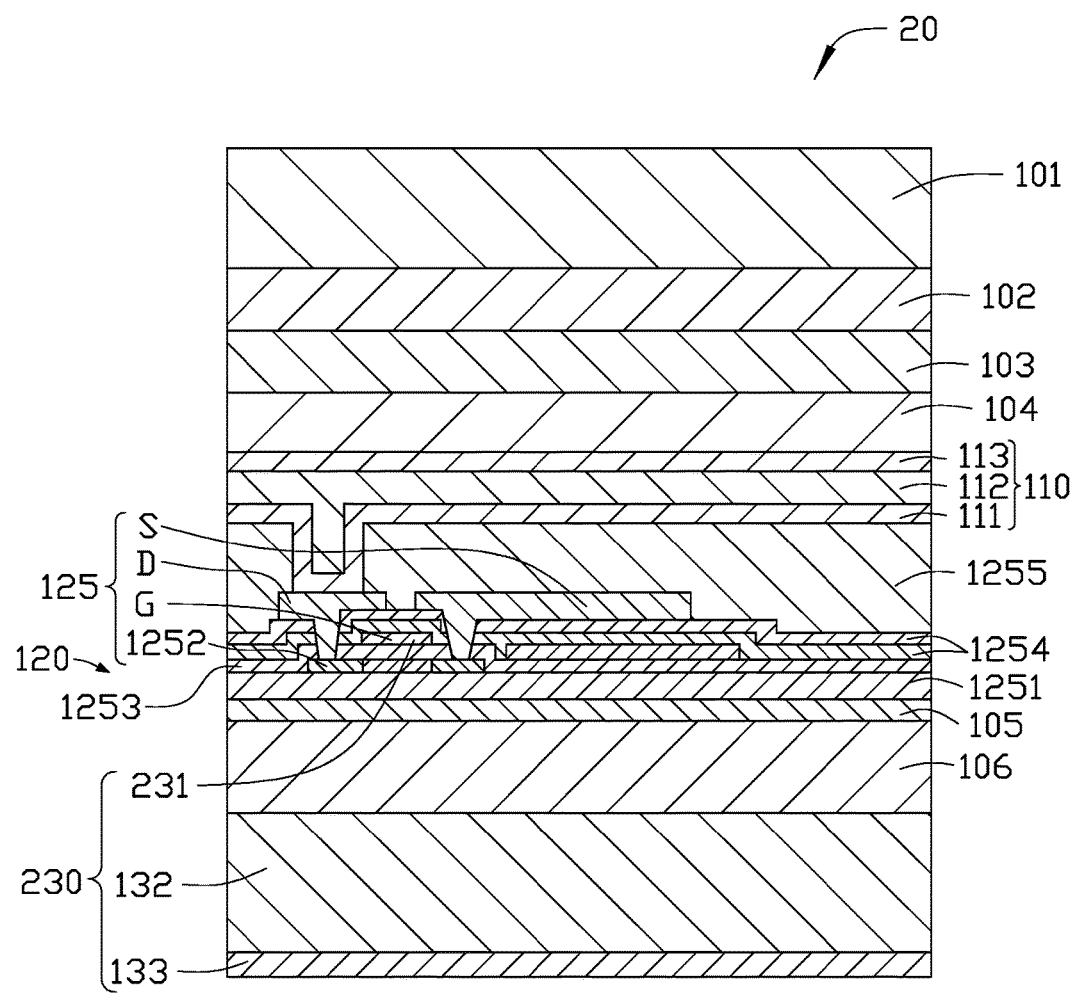
FIG. 4 is a cross-sectional view of a second exemplary embodiment of a display

FIG. 4 illustrates a second exemplary embodiment of part of the display panel 20 in cross section. The display panel 20 is an organic light emitting display panel. The display panel 20 is substantially the same as the display panel 10, except that the force sensor 230 of the display panel 20 is different from the force sensor 130 of the display panel 10 in FIG. 1.

The gate electrode G of the TFT 125 can also function as the first conductive layer 231 of the force sensor 230. The force sensor 230 includes a first conductive layer 231 shared with the gate electrode G of the TFT 125, an elastic layer 132 formed on a side of the substrate 106 away from the first conductive layer 231, and a second conductive layer 133 formed on a side of the elastic layer 132 away from the substrate 106. The display driving operation and the force sensing driving operation of the first conductive layer 231 are carried out in a time division method. A plurality of conductive lines (not shown) electrically coupled to the gate electrode G of the TFT 125 may also be formed to transmit signals from the gate electrode G to an external circuit (not shown).

The gate electrodes G of all the TFTs 125 can function as the first conductive layer 231 of the force sensor 230. Alternatively, only some of the TFTs 125 may have gate electrodes G that function as the first conductive layer 231 of the force sensor 230. For example, only the gate electrodes G of the TFTs 125a can function as the first conductive layer 231 of the force sensor 230. Alternatively, only the gate electrodes G of the TFT's 125b can function as the first conductive layer 231 of the force sensor 230. in other exemplary embodiments, the gate electrodes G of some of the TFTs 125a and the gate electrodes G of some of the TFTs 125b can function as the first conductive layer 231 of the force sensor 230.

In other exemplary embodiments, the force sensor 230 may include a first conductive layer 231 that is not shared with the gate electrode G of the TFT 125. Herein, both the first conductive layer 231 and the gate electrodes G of the TFTs 125 are formed on a surface of the first insulative layer 1253 away from the substrate 106 The first conductive layer 231 and the gate electrodes G of the TFTs 125 are defined by a single conductive layer and are formed in a single patterning process.

Figure 5:
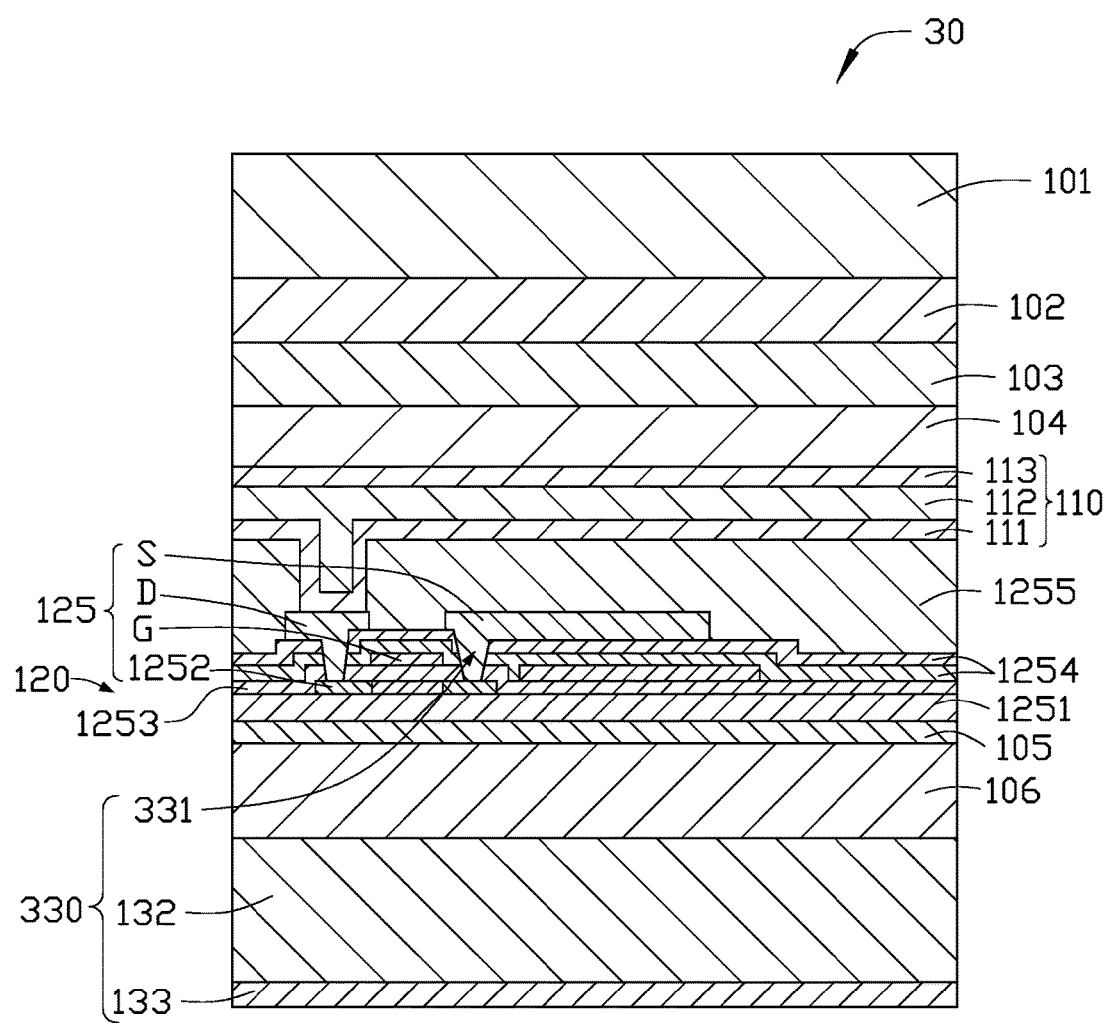
FIG. 5 is a cross-sectional view of a third exemplary embodiment of a display panel.

FIG. 5 illustrates a third exemplary embodiment of part of the display panel 30 in cross section. The display panel 30 is an organic light emitting display panel. The display panel 30 is substantially the same as the display panel 10, except that the force sensor 330 of the display panel 30 is different from the force sensor 130 of the display panel 10.

The force sensor 330 includes a first conductive layer 331 shared with the source electrodes S and the drain electrodes D of the TFTs 125. An elastic layer 132 is formed on a side of the substrate 106 away from the first conductive layer 331, and a second conductive layer 133 is formed on a side of the elastic layer 132 away from the substrate 106. The source electrodes S and the drain electrodes D of the TFTs 125 can also function as the first conductive layer 331 of the force sensor 330. The display driving operation and the force sensing driving operation of the first conductive layer 331 are carried out in a time division method. A plurality of conductive lines (not shown) that are electrically coupled to the source electrodes S and the drain electrodes D of the TFTs 125 may also be formed to transmit signals from the source electrodes S and the drain electrodes D to an external circuit (not shown).

As shown in FIG. 5, the gate electrode G of each TFT 125 faces a gap between the source electrode S and the drain electrode D. A projection of the gate electrode G of each TFT 125 on the substrate 106 does not overlap a projection of the source electrode S and the drain electrode D of each TFT 125 on the substrate 106. Thus, the source electrode S and the drain electrode D of each TFT 125 that are sharer with the first conductive layer 331 have very little effect on the gate electrode G.

The source electrodes S and the drain electrodes D of each TFT 125 can function as the first conductive layer 331 of the force sensor 330. Alternatively, only some of the TFTs 125 may have the source electrodes S and the drain electrodes D that function as the first conductive layer 331 of the force sensor 130. For example, only the source electrodes S and the drain electrodes D of the TFTs 125a can function as the first conductive layer 331 of the force sensor 330. Otherwise, only the source electrodes S and the drain electrodes D of the TFTs 125b can function as the first conductive layer 331 of the force sensor 330. In other embodiments, the source electrodes S and the drain electrodes D of some of the TFTs 125a and the source electrodes S and the drain electrodes D of some of the TFTs 125b can function as the first conductive layer 331 of the force sensor 330.

In other exemplary embodiments, the force sensor 330 may include a first conductive layer 331 that is not shared with the source electrodes S and the drain electrodes D of the TFTs 125. Herein, both the first conductive layer 331 and the source electrodes S and the drain electrodes U of the TFTs 125 are formed on a surface of the second insulative layer 1253 away from the substrate 106. The first conductive layer 331 and the source electrodes S and the drain electrodes D of the TFTs 125 are defined by a single conductive layer and are formed in a single patterning process.

The embodiments shown and described above are only examples. Many details are often found in the art such as other features of a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A display panel comprising:
   a substrate;
   at least one thin film transistor (TFT) on the substrate; and
   a force sensor configured to detect touch force on the display panel;
   wherein the force sensor comprises a first conductive layer on the substrate and a second conductive layer; wherein the first conductive layer is located between the at least one TFT and the substrate; the second conductive layer is located at a side of the substrate away from the at least one TFT.

2. The display panel of claim 1, wherein the first conductive layer comprises a plurality of electrode units spaced apart from each other.

3. The display panel of claim 2, wherein the plurality of electrodes is arranged in an array.

4. The display panel of claim 2, wherein the plurality of electrodes is used as electrodes for sensing touch position.

5. The display panel of claim 2, wherein the at least one TFT comprises a channel layer, a gate electrode, a source electrode, and a drain electrode; the channel layer defines an active region; a projection of the active region or the gate electrode on the substrate does not overlap any projections of the plurality of electrode units on the substrate.

6. The display panel of claim 1, wherein the at least one TFT comprises a channel layer, a gate electrode, a source electrode and a drain electrode; the display panel further comprises a buffer layer on the substrate, a first insulative layer, a second insulative layer, and a planar layer; the channel layer is formed on the buffer layer; the first insulative layer is formed on the buffer layer and covers the channel layer; the gate electrode is formed on the first insulative layer; the second insulative layer is formed on the first insulative layer and covers the gate electrode; both the source electrode and the drain electrode are formed on the second insulative layer and extend through the second insulative layer and the first insulative layer to electrically couple to the channel layer.

7. The display panel of claim 6, wherein the first conductive layer is located between the buffer layer and the substrate.

8. The display panel of claim 1, wherein the at least one TFT comprises a channel layer, a gate electrode, a source electrode, and a drain electrode; the first conductive layer is used as the gate electrode of the at least one of the TFT.

9. The display panel of claim 1, wherein the at least one TFT comprises a channel layer, a gate electrode, a source electrode, and a drain electrode; the first conductive layer is also used as the source electrode and the drain electrode of the at least one of the TFT.

10. The display panel of claim 9, wherein a projection of the gate electrode of the at least one of the TFT on the substrate does not overlap any projections of the source electrode and the drain electrode of the at least one TFT on the substrate.

11. The display panel of claim 1, wherein the second conductive layer is a continuous layer.

12. The display panel of claim 1, wherein an elastic layer is located between the first conductive layer and the second conductive layer.

13. The display panel of claim 12, wherein the elastic layer is capable of deforming when a touch force is applied to the display panel; and a distance between the first conductive layer and the second conductive layer varies.

14. The display panel of claim 1, wherein the first conductive layer and the second conductive layer are located at opposite sides of the substrate.

15. The display panel of claim 1, wherein the display panel is an organic display panel.

16. The display panel of claim 15, wherein the display panel further comprises a plurality of light emitting units formed at a side of the driving module away from the substrate.

* * * * *